United States Patent
Chen et al.

(10) Patent No.: US 7,070,490 B2
(45) Date of Patent: Jul. 4, 2006

(54) VACUUM SUCTION MEMBRANE FOR HOLDING SILICON WAFER

(75) Inventors: Tzu-Shin Chen, Taipei Hsien (TW); Ming-Hsing Kao, Tainan Hsien (TW); Wen-Chin Lin, Kaohsiung Hsien (TW); Hua-Bin Chi, Yunlin Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/109,015

(22) Filed: Mar. 28, 2002

(65) Prior Publication Data

US 2003/0157870 A1   Aug. 21, 2003

(30) Foreign Application Priority Data

Feb. 15, 2002   (TW) ............................... 91102579 A

(51) Int. Cl.
  *B24B 5/00*   (2006.01)
(52) U.S. Cl. ....................... 451/289; 451/388
(58) Field of Classification Search ............... 451/289, 451/388, 41, 288
  See application file for complete search history.

(56) References Cited

U.S. PATENT DOCUMENTS

| | | | | | |
|---|---|---|---|---|---|
| 3,033,298 | A | * | 5/1962 | Johnson ....................... | 175/209 |
| 3,747,282 | A | * | 7/1973 | Katzke ....................... | 451/388 |
| 4,778,326 | A | * | 10/1988 | Althouse et al. ............. | 414/800 |
| 5,423,716 | A | * | 6/1995 | Strasbaugh .................. | 451/388 |
| 5,624,299 | A | * | 4/1997 | Shendon ....................... | 451/28 |
| 6,513,796 | B1 | * | 2/2003 | Leidy et al. ................. | 451/388 |
| 6,537,141 | B1 | * | 3/2003 | Liu et al. ..................... | 451/285 |

* cited by examiner

*Primary Examiner*—Hadi Shakeri
(74) *Attorney, Agent, or Firm*—J.C. Patents

(57) ABSTRACT

A membrane for vacuum suction of a silicon water typically used inside a polishing head. The membrane has a flat main body and a plurality of protrusions each having a spiny shape over the surface of the flat main body. The protrusions are formed in positions that correspond to the holes of a supporting multiple-hole panel. The protrusions on the flat main body lower the suction pressure between the wafer and the membrane somewhat so that wafer unloading failure is minimized.

15 Claims, 2 Drawing Sheets

VACUUM SUCTION MEMBRANE FOR HOLDING SILICON WAFER

CROSS-REFERENCE TO RELATED APPLICATION

This application claims the priority benefit of Taiwan application serial no. 91102579, filed Feb. 15, 2002.

BACKGROUND OF THE INVENTION

1. Field of Invention

The present invention relates to a semiconductor transport device. More particularly, the present invention relates to a vacuum suction membrane for holding a silicon wafer.

2. Description of Related Art

Wafer transport systems use a variety of mechanisms for transport, the most common and widely used method of which is creating a vacuum to suck up a silicon wafer. The vacuum suction method is used, for example, in a chemical-mechanical polishing device to hold a silicon wafer.

FIG. 1 is simplified and localized cross-sectional view of a conventional chemical-mechanical polishing device. As shown in FIG. 1, the chemical-mechanical polishing device includes a polishing head 100 and a polishing table 110. A polishing pad 120 covers the polishing table 110. The polishing head 100 further includes a gripping pan 102 having an elastic membrane 106 therein. When the polishing head 100 presses upon a silicon wafer 108, the downward pressure produced by the polishing head 100 on the wafer 108 is evenly spread out so that the wafer 108 can be polished smoothly.

However, at the end of a chemical-mechanical polishing operation, an external robotic arm is often used to unload the wafer 108 from the polishing table 110 and then transfer the wafer 108 elsewhere. To smooth the process and reduce operating cost, the polishing head 100 often incorporates a vacuum system. In other words, the gripping pan 102 structure is frequently modified to include a set of internal gaseous pipelines. In addition, a multiple-hole panel is inserted between the gripping pan 102 and the membrane 106 such that the membrane 106 also encloses the bottom section of the multiple-hole panel. After a chemical-mechanical polishing operation, a vacuum system may be triggered to create a vacuum state inside the polishing head 100 through the set of internal gaseous pipelines. Hence, the membrane 106 originally pressed against the wafer 108 now attaches to the wafer 108 through suction. Thereafter, the polishing head 100 may move to carry the wafer 108 away. On releasing the vacuum inside the polishing head 100, suction between the membrane 106 and the wafer 108 disappears and the wafer 108 drops off from the polishing head 100.

FIG. 2 is a schematic top view of a conventional multiple-hole panel inside a vacuum-suction polishing head. As shown in FIG. 2, the multiple-hole panel 200 has a shape that corresponds to a silicon wafer. Hence, the multiple-hole panel 200 is circular and contains a number of holes 202. At the end of a polishing operation, the polishing head is turned into a vacuum state. Through differential pressure acting via the holes 202, the elastic membrane 106 contracts into the hole 202 resulting in a suction pressure on the wafer.

However, the conventional technique has some drawbacks in real applications. The polishing head must return to normal pressure after a polishing operation so that the wafer attached to the membrane can drop off. Due to considerable suction between the membrane and the wafer, the wafer may not unload normally. In other words, the wafer is still attached to the membrane after the polishing head has returned to a normal pressure. Eventually, the wafer may be damaged due to subsequent mishandling.

In addition, because there is no membrane between the multiple-hole panel for sucking up the wafer and the wafer, the process of creating a suction vacuum also carries some micro-particles from the surrounding atmosphere towards the wafer leading to wafer contamination.

SUMMARY OF THE INVENTION

Accordingly, one object of the present invention is to provide a membrane for vacuum suction of a silicon wafer such that excessive suction pressure between the membrane and the wafer that may lead to unloading failure is prevented.

A second object of this invention is to provide a membrane for vacuum suction of a silicon wafer such that time and labor for processing unloading failure is reduced.

A third object of this invention is to provide a membrane for vacuum suction of a silicon wafer such that contamination of the wafer is prevented.

To achieve these and other advantages and in accordance with the purpose of the invention, as embodied and broadly described herein, the invention provides a device having a membrane therein typically incorporated into a polishing head for sucking up a silicon wafer. The device includes a flat main body and a plurality of minute protrusions such as micro-particles on the surface of the flat main body. The minute protrusions are positioned over corresponding holes of a polishing head suction panel.

The minute protrusions on the vacuum suction membrane according to this invention are able to reduce suction pressure between the wafer and the membrane after the removal of suction. Hence, the design is able to minimize wafer damage due to unloading failure.

The membrane for vacuum suction of a silicon wafer according to this invention is quite effective in unloading a wafer. Thus, time and labor required to process failure in wafer unloading is minimized and yield of the wafer is increased.

Furthermore, the provision of a membrane between the wafer suction panel and the wafer cuts off all deposition of contaminant particles from surrounding air in the process of creating a vacuum.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
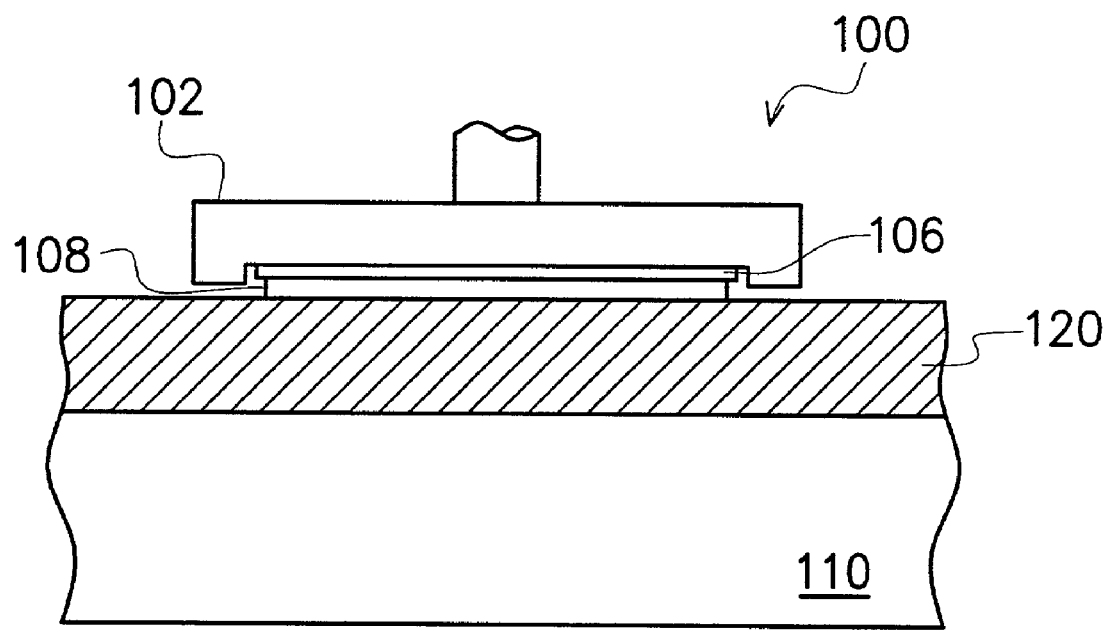
FIG. 1 is simplified and localized cross-sectional view of a conventional chemical-mechanical polishing device.
Figure 2:
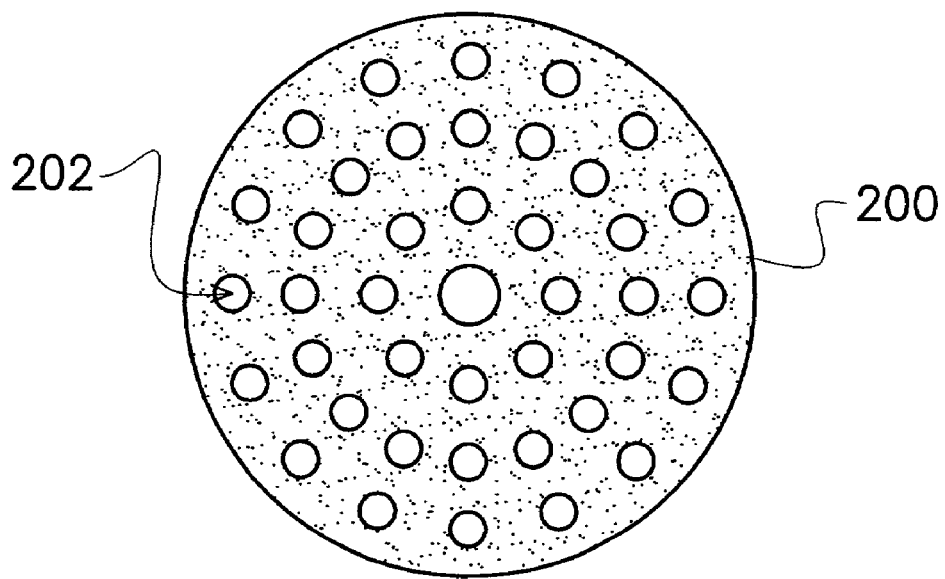
FIG. 2 is a schematic top view of a conventional multiple-hole panel inside a vacuum suction polishing head.

Reference will now be made in detail to the present preferred embodiments of the invention, examples of which are illustrated in the accompanying drawings. Wherever possible, the same reference numbers are used in the drawings and the description to refer to the same or like parts.

This invention provides a membrane for vacuum suction of silicon wafers that can be incorporated with a chemical-mechanical polishing device. The membrane serves as a film for enclosing a multiple-hole panel inside a polishing head. However, the membrane can also be applied to various other vacuum suction devices for transferring or holding wafers.

The chemical-mechanical polishing device used as an example in the description includes a polishing head and a polishing table. The polishing head is connected to a vacuum system. The polishing head further includes a gripping pan for stationing a wafer. Details inside the gripping panel are shown in FIGS. 3A, 3B and 4.

Figure 3A:
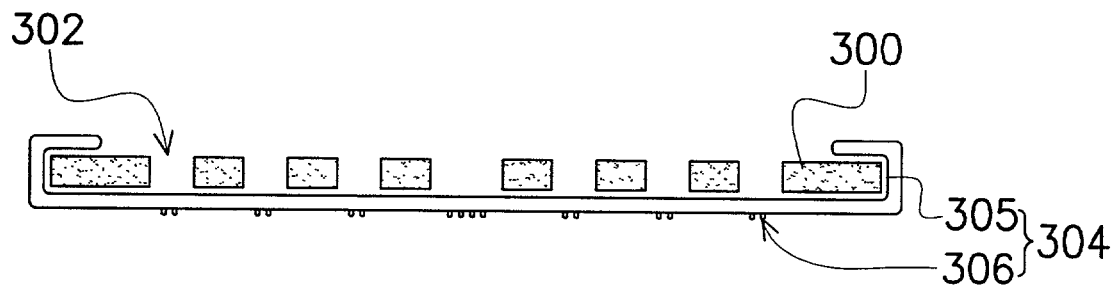
FIG. 3A is a schematic cross-sectional view of a multiple-hole panel and a membrane that encloses the bottom section of the multiple-hole panel according to one preferred embodiment of this invention.
Figure 4:
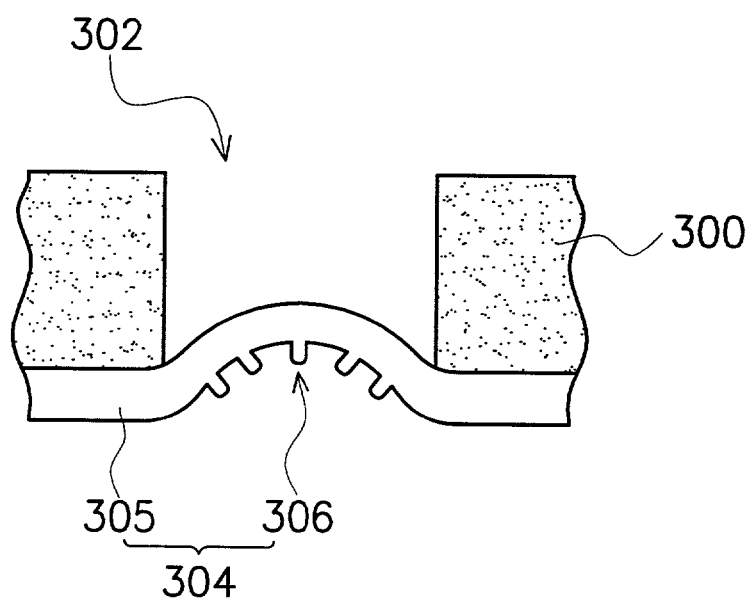
FIG. 4 is a local magnification of a portion IV shown in FIG. 3B.

FIG. 3A is a schematic cross-sectional view of a multiple-hole panel and a membrane that encloses the bottom section of the multiple-hole panel according to one preferred embodiment of this invention. As shown in FIG. 3A, inside the gripping panel (not shown in the figure) of the polishing head is a multiple-hole panel 300 having a plurality of holes 302 therein. A membrane 304 fabricated according to this invention wraps around the bottom section of the multiple-hole panel 300. The membrane 304 includes a flat main body 305 and a plurality of minute spiny protrusions 306 on the surface of the flat main body 305. Both the flat main body 305 and the spiny protrusions 306 are made from an identical material. The spiny protrusions 306 may have a spiny shape, for example. The protrusions 306 are positioned on the membrane 304 over corresponding holes 302 of the multiple-hole panel 300, for example. For a membrane having a diameter of about 300 mm, each protrusion 306 has a diameter of about 2 mm and a height of about 2 mm. However, the protrusions 306 may have other shapes, dimensions or density on the membrane in order to produce a device having an optimal wafer suction/unloading capability. For example, the quantity of protrusions 306 on the membrane 304 may vary according to the size of holes 302 in the multiple-hole panel 300. In other words, total quantity of protrusions in an area over a larger hole may be greater than total quantity of protrusions in an area over a smaller bole.

When the polishing head is conducting a polishing operation, the multiple-hole panel 300 presses downward against the wafer. At the end of the polishing operation, the vacuum system is triggered to turn the interior of the polishing head into a vacuum state so that the polishing head can be used as a tool for moving the wafer elsewhere. How the vacuum system of this invention is able to suck up a wafer is explained in greater detail with reference to FIG. 3B.

Figure 3B:
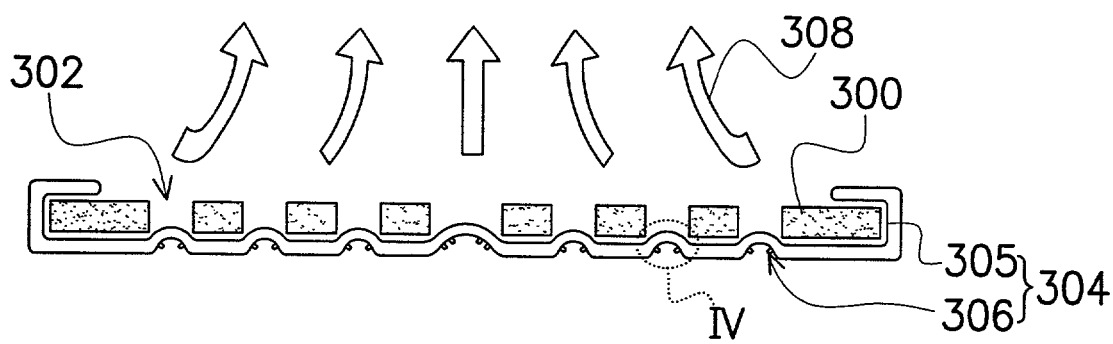
FIG. 3B is a schematic cross-sectional view showing the configuration of the system in FIG. 3A after creating a suction pressure.

FIG. 3B is a schematic cross-sectional view showing the configuration of the system in FIG. 3A after creating a suction pressure. As shown in FIG. 3B, air within the polishing head is evacuated in step 308 to create a partial vacuum so that the multiple-hole panel 300 has a pressure differential between the interior and the exterior. Consequently, the portion of membrane 304 positioned directly over the holes 302 cave upward towards the upper section of the multiple-hole panel 300. Originally, the membrane 304 is pressed tightly against the wafer, but now the membrane 304 attaches to the wafer through suction. Because the membrane 304 has a plurality of minute protrusions 306 on the surface, suction pressure between the membrane 304 and the wafer is slightly lowered when the wafer is attached. Details of how the membrane 304 functions over the hole 302 are further explained using FIG. 4.

FIG. 4 is a local magnification of a portion IV shown in FIG. 3B. When a vacuum state is created inside the polishing head, the membrane region over the holes 304 caves upward towards the upper section of the multiple-hole panel 300. Thus, the membrane 304 around the holes produces an upward suction.

A comparison between the membrane of this invention and a conventional design can be made here. In a conventional design, a suction-like counteraction is often created trying to remove the downward pressure on the wafer during the polishing operation. Thus, the counteraction provides a suction force between the membrane and the wafer even before a vacuum suction is created. Hence, when the wafer is carried under vacuum suction, the suction between the wafer and the membrane at the bottom section of the multiple-hole panel exceeds the desired suction considerably. Such an excessive suction often results in a failure to unload the wafer from the polishing head even when the vacuum state is canceled. The failure of disengagement between the polishing head and the wafer may lead to defective polishing when the wafer undergoes a float polishing operation inside a float polisher, for example.

On the contrary, the membrane fabricated according to this invention has protrusions around the holes of the multiple-hole panel. Since the protrusions cancel most of the suction due to counteraction after removing the pressure on the wafer, there is no excess counteraction before the creation of a vacuum suction between the wafer and the membrane. Once the vacuum state in the polishing head is relieved, suction between the wafer and the membrane immediately disappears and the wafer unloads from the membrane smoothly. Consequently, the probability of wafer unloading failure is greatly reduced.

In addition, if this invention is applied to other vacuum suction transport or wafer holding systems, the presence of a membrane between the multiple-hold panel and the wafer prevents any deposition of contaminants on the wafer when the vacuum is created.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A membrane for vacuum suction of a silicon wafer, wherein the membrane is particularly suitable for wrapping a panel having a plurality of holes thereon inside a polishing head, comprising:

a flat main body; and a plurality of protrusions distributed on a surface of the flat main body of the membrane, wherein the protrusions on the membrane are placed in positions that correspond to the holes on the multiple-hole panel, wherein the protrusion has a particle shape, and a number of protrusions for each corresponding hole having a larger size is greater than a number of protrusions for each corresponding hole having a smaller size.

2. The membrane of claim 1, wherein the flat main body and the protrusions are made from identical substance.

3. The membrane of claim 1, wherein the protrusion has a diameter of about 2 mm.

4. The membrane of claim 1, wherein the protrusion has a height of about 2 mm.

5. A wafer suction device coupled to an external vacuum-driving system, comprising:
   a multiple-hole panel having a bottom section and a plurality of holes therein; and
   a membrane wrapping around the bottom section of the multiple-hole panel, the membrane comprising:
      a flat main body; and
      a plurality of protrusions distributed on a surface of the flat main body of the membrane, wherein the protrusions on the membrane are placed in positions that correspond to the holes on the multiple-hole panel, wherein the protrusion has a particle shape, and a number of protrusions for each corresponding hole having a larger size is greater than a number of protrusions for each corresponding hole having a smaller size.

6. The wafer suction device of claim 5, wherein the flat main body and the protrusions are made from an identical substance.

7. The wafer suction device of claim 5, wherein the protrusion has a diameter of about 2 mm.

8. The wafer suction device of claim 5, wherein the protrusion has a height of about 2 mm.

9. A vacuum suction polishing head having a gripping pan, the inside of the gripping pan comprising:
   a multiple-hole panel having a plurality of holes thereon; and
   a membrane at the bottom section of the multiple-hole panel, wherein a surface of the membrane has a plurality of protrusions, wherein the protrusion has a particle shape, and a number of protrusions for each corresponding hole having a larger size is greater than a number of protrusions for each corresponding hole having a smaller size.

10. The vacuum suction polishing head of claim 9, wherein the membrane and the protrusions are made from an identical substance.

11. The vacuum suction polishing head of claim 9, wherein the protrusion has a diameter of about 2 mm.

12. The vacuum suction polishing head of claim 9, wherein the protrusion has a height of about 2 mm.

13. A membrane for vacuum suction of a silicon wafer, wherein the membrane is particularly suitable for wrapping a panel having a plurality of holes thereon inside a polishing head, comprising:
   a flat main body without hole; and
   a plurality of protrusions distributed on a surface of the flat main body of the membrane, wherein the protrusions on the membrane are placed in positions that correspond to the holes on the multiple-hole panel, and a number of protrusions for each corresponding hole having a larger size is greater than a number of protrusions for each corresponding hole having a smaller size.

14. A wafer suction device coupled to an external vacuum-driving system, comprising:
   a multiple-hole panel having a bottom section and a plurality of holes therein; and
   a membrane wrapping around the bottom section of the multiple-hole panel, the membrane comprising:
      a flat main body without hole; and
      a plurality of protrusions distributed on a surface of the flat main body of the membrane, wherein the protrusions on the membrane are placed in positions that correspond to the holes on the multiple-hole panel, and a number of protrusions for each corresponding hole having a larger size is greater than a number of protrusions for each corresponding hole having a smaller size.

15. A vacuum suction polishing head having a gripping pan, the inside of the gripping pan comprising:
   a multiple-hole panel having a plurality of holes thereon; and
   a membrane without hole at the bottom section of the multiple-hole panel, wherein a surface of the membrane has a plurality of protrusions, and a number of protrusions for each corresponding hole having a larger size is greater than a number of protrusions for each corresponding hole having a smaller size.

* * * * *